United States Patent
Schwarz et al.

(10) Patent No.: US 7,903,716 B2
(45) Date of Patent: Mar. 8, 2011

(54) SURFACE EMITTING SEMICONDUCTOR LASER HAVING AN INTERFERENCE FILTER

(75) Inventors: Thomas Schwarz, Regensburg (DE); Ulrich Steegmüller, Regensburg (DE); Michael Kühnelt, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 567 days.

(21) Appl. No.: 11/048,269

(22) Filed: Jan. 31, 2005

(65) Prior Publication Data
US 2005/0226304 A1 Oct. 13, 2005

(30) Foreign Application Priority Data

Jan. 30, 2004 (DE) ............ 10 2004 004 776
Mar. 9, 2004 (DE) ............ 10 2004 011 456

(51) Int. Cl.
*H01S 3/08* (2006.01)
(52) U.S. Cl. ......... 372/98; 372/50.124; 372/69; 372/70; 372/71; 372/72; 372/75; 372/93; 372/99
(58) Field of Classification Search ............. 372/69–75, 372/50.124, 93, 98, 99
See application file for complete search history.

(56) References Cited

U.S. PATENT DOCUMENTS

| | | | | |
|---|---|---|---|---|
| 4,009,453 A | * | 2/1977 | Mahlein | 372/99 |
| 5,436,920 A | * | 7/1995 | Minemoto et al. | 372/21 |
| 5,991,318 A | * | 11/1999 | Caprara et al. | 372/22 |
| 6,042,785 A | * | 3/2000 | Harju | 422/52 |
| 6,167,068 A | * | 12/2000 | Caprara et al. | 372/22 |
| 6,243,407 B1 | | 6/2001 | Mooradian | |
| 6,393,038 B1 | * | 5/2002 | Raymond et al. | 372/22 |
| 6,496,523 B1 | * | 12/2002 | Wach | 372/32 |
| 2002/0001328 A1 | | 1/2002 | Albrecht et al. | |
| 2002/0026981 A1 | * | 3/2002 | Fukushima | 156/264 |
| 2003/0012230 A1 | | 1/2003 | Hopkins et al. | |
| 2003/0053512 A1 | | 3/2003 | Baillargeon et al. | |
| 2003/0193672 A1 | * | 10/2003 | Okada et al. | 356/630 |
| 2003/0231666 A1 | | 12/2003 | Daiber et al. | |
| 2004/0022286 A1 | | 2/2004 | Spath et al. | |
| 2004/0071181 A1 | * | 4/2004 | Huang | 372/106 |
| 2005/0281308 A1 | * | 12/2005 | Kim | 372/70 |

FOREIGN PATENT DOCUMENTS

GB 2 399 942 A 9/2004

(Continued)

OTHER PUBLICATIONS

Wang et al "Stepwise graded refractive-index profiles for design of a narrow-bandpass filter", Applied Optics, vol. 40, No. 22. p. 3746-3752, Aug 2001.*

*Primary Examiner* — Minsun Harvey
*Assistant Examiner* — Yuanda Zhang
(74) *Attorney, Agent, or Firm* — Cohen Pontani Lieberman & Pavane LLP

(57) ABSTRACT

A surface emitting semiconductor laser includes a semiconductor chip (1), which emits radiation (12) and contains a first resonator mirror (3). A second resonator mirror (6) is arranged outside the semiconductor chip (1). The first resonator mirror (3) and the second resonator mirror (6) form a laser resonator for the radiation (12) emitted by the semiconductor chip (1). The laser resonator contains an interference filter (9, 17), which is formed from an interference layer system comprising a plurality of dielectric layers.

11 Claims, 4 Drawing Sheets

FOREIGN PATENT DOCUMENTS

| | | |
|---|---|---|
| JP | 57-186056 | 11/1982 |
| JP | 3-50592 | 3/1991 |
| JP | 6-326382 | 11/1994 |
| JP | 8-129105 | 5/1996 |
| JP | 11-121836 | 4/1999 |
| JP | 2002-353555 | 12/2002 |
| JP | 2003-304033 | 10/2003 |
| WO | WO 01/95445 | 12/2001 |
| WO | WO 02/25782 A2 | 3/2002 |
| WO | WO 03/094311 | 11/2003 |

* cited by examiner

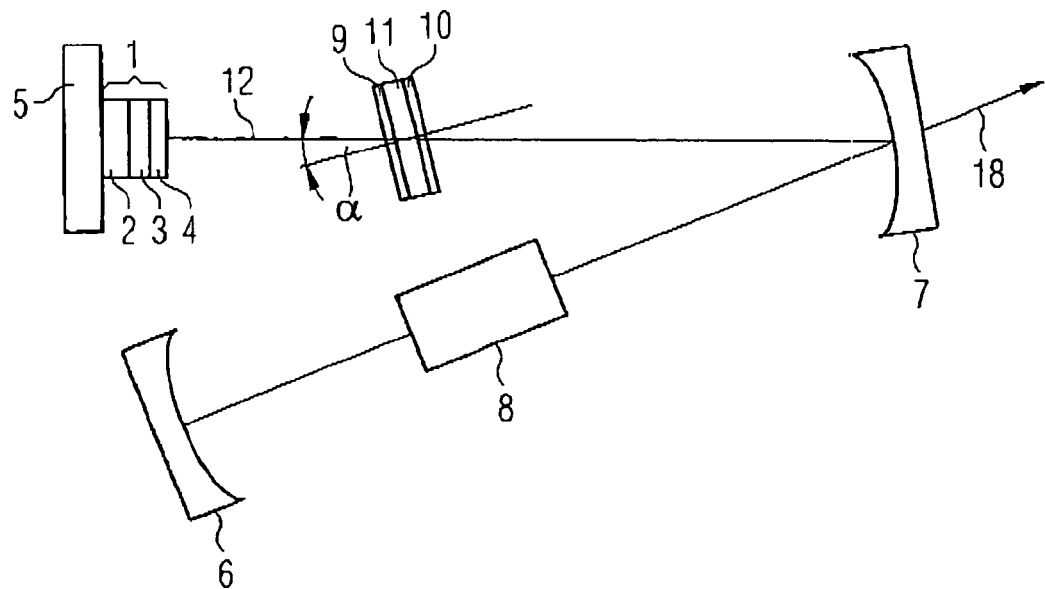
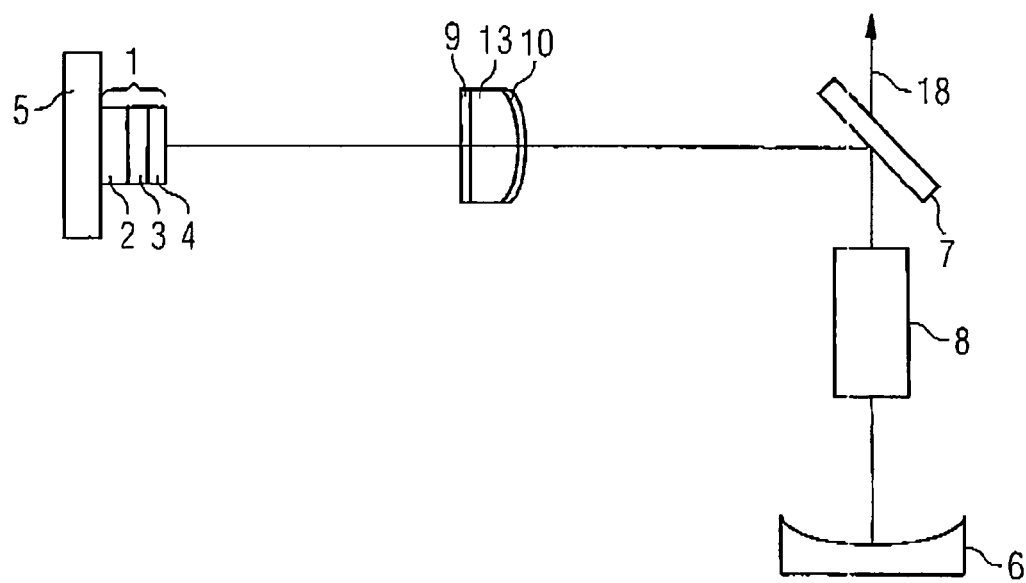

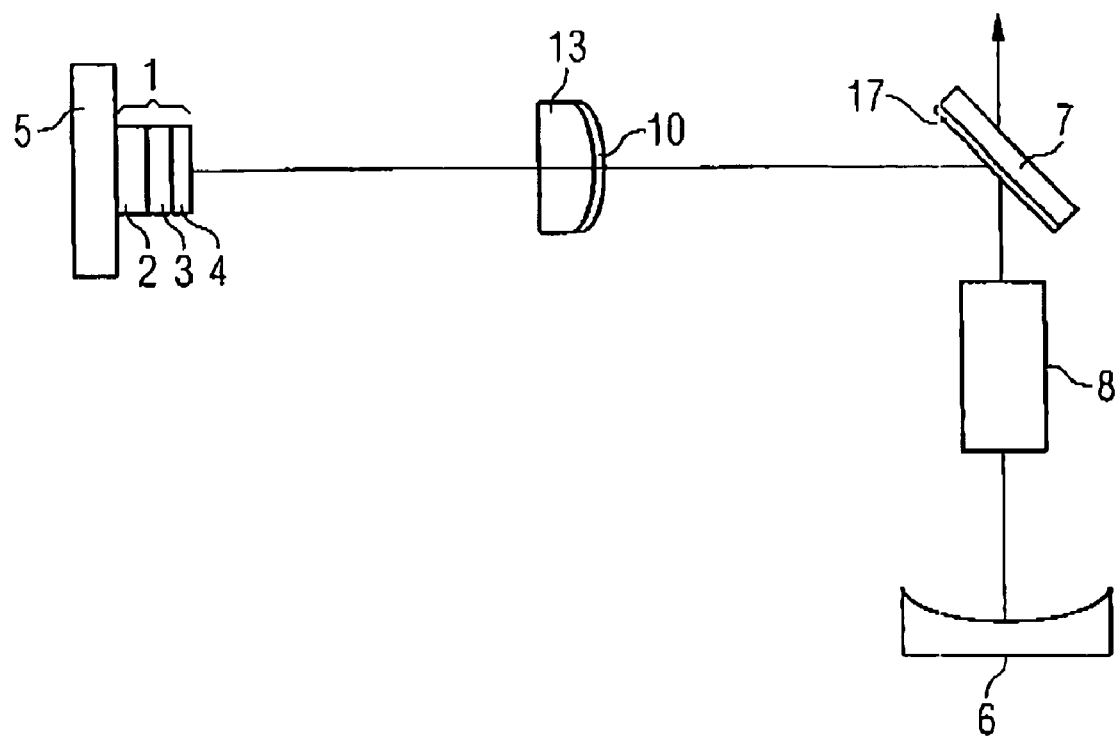

SURFACE EMITTING SEMICONDUCTOR LASER HAVING AN INTERFERENCE FILTER

RELATED APPLICATIONS

This patent application claims the priority of German patent applications 102004011456.0 and 102004004776.6, the disclosure content of which is hereby incorporated by reference.

FIELD OF THE INVENTION

The invention relates to a surface emitting semiconductor laser having an optically or electrically pumped semiconductor chip, which emits radiation.

BACKGROUND OF THE INVENTION

Such surface emitting semiconductor lasers are also known by the terms disc laser, VECSEL (Vertical External Cavity Surface Emitting Laser) or OPSL (Optically Pumped Semiconductor Laser) and are described for example in the published U.S. patent application Ser. No. 2002/0001328, U.S. patent application Ser. No. 10/53,364 and U.S. Pat. No. 6,243,407, the content of all of which is hereby incorporated by reference.

Surface emitting semiconductor lasers that are used in particular in the infrared spectral region emit at high pump powers in a spectrally broadband fashion in a wavelength range that may be a plurality of nanometers wide. Therefore, it is often necessary to stabilize the emission wavelength and to control the spectral width of the emission. This is the case particularly when a resonator-internal frequency doubling is provided.

With regard to a high quality factor of the resonator and a broadband emission, dye lasers or titanium-sapphire lasers represent systems comparable to the disc laser. In the case of these lasers, so-called etalons and bifringent filters are used for controlling the spectral properties of the emission. Etalons are based on the principle of multiple reflection at plane-parallel laminae and enable the wavelength to be tuned in a limited range by variation of the angle of incidence. Such etalons fundamentally require a largely parallel beam course.

Bifringent filters lead to wavelength- and polarization-dependent losses and stabilize the laser as a result at a preferred wavelength. They are suitable particularly for tunable lasers since the wavelength of the laser can be set in a wide range by means of azimuthal rotation of the filter without influencing the other resonator conditions.

Both etalons and bifringent filters are suitable for comparatively low-loss resonator-internal wavelength selection. However, they require a resonator design with little beam divergence and impose high requirements on the alignment accuracy of the angle of incidence or of the azimuthal angle.

The use of a bifringent filter for wavelength selection in a disc laser is disclosed in U.S. Pat. No. 6,167,068. This document also describes a resonator-internal wavelength conversion of the surface emitting semiconductor laser.

SUMMARY OF THE INVENTION

One object of the invention is to provide a surface emitting semiconductor laser having an improved resonator-internal filter for stabilizing the emission wavelength and for controlling the spectral width of the emission.

This and other objects are attained in accordance with one aspect of the invention directed to a surface emitting semiconductor laser having an optically or electrically pumped semiconductor chip, which emits radiation and contains a first resonator mirror, and having a second resonator mirror arranged outside the semiconductor chip. The first resonator mirror and the second resonator mirror form a laser resonator for the radiation emitted by the semiconductor chip. The laser resonator contains an interference filter which is formed from an interference layer system comprising a plurality of dielectric layers.

The wavelength and the spectral width of the laser emission can be varied within the amplification spectrum of the laser by means of the design and/or the angle of incidence at which the laser radiation impinges on the interference filter. An interference filter comprising an interference layer system comprising a plurality of dielectric layers is comparatively cost-effective to produce and can advantageously be applied to an element present in the laser resonator. The production and alignment outlay is thereby reduced. The requirement made of little beam divergence is reduced in comparison with the use of an etalon or a bifringent filter.

The special properties of the surface emitting semiconductor laser, in particular the comparatively narrowband amplification spectrum in comparison with other tunable laser systems having a width of approximately 10 nm to 30 nm and its sensitive reaction to resonator-internal losses, enable the application of a dielectric interference filter in a laser of this type. On account of these properties, it is possible, in the design of the filter, to accept a comparatively small narrowband nature and sideband suppression in favor of lower losses. In contrast thereto, customary dielectric interference filters have not been used hitherto in laser resonators having a high quality factor on account of their characteristic, in particular owing to the typical maximum transmission of distinctly less than 99%.

The interference filter may be embodied, for example, as a bandpass filter, that is to say as a transmission filter. In this case, it is advantageously applied to an optical element contained in the laser resonator. The optical element is, by way of example, a lens or an optically non-linear crystal for frequency conversion of the radiation. The frequency conversion may involve a frequency multiplication, in particular a frequency doubling. In the case of a bandpass filter applied to an optical element, the opposite surface of the optical element is preferably provided with an antireflection coating in order to advantageously increase the transmission of this element.

As an alternative to applying the bandpass filter to an optical element contained in the laser resonator, the bandpass filter may also be applied to a surface of the semiconductor chip through which radiation is emitted from the semiconductor chip.

In a variant of this embodiment of the invention, the surface emitting semiconductor laser has a pump radiation source that is arranged outside the semiconductor chip and radiates pump radiation into the semiconductor chip, the bandpass filter having a first passband for the wavelength of the laser radiation and a second passband for the wavelength of the pump radiation. However, the pump radiation source of the surface emitting semiconductor chip may also be integrated monolithically on the semiconductor chip. In this case, it is not necessary for the bandpass filter to have a passband for the pump radiation.

The transmission of the bandpass filter is preferably greater than 99.8% at the wavelength of the laser radiation.

In a further embodiment of the invention, the interference filter is a reflective interference filter which, in contrast to a narrow transmission band, as in the case of the bandpass filter, has a narrow reflection band with a high reflection. Since the laser resonator has a good quality factor only within said narrow reflection band, the emission of laser radiation outside the reflection band is prevented and a similar effect to that with a resonator-internal bandpass filter is achieved in this way. In particular, a wavelength selection or stabilization of the laser can be achieved through the setting of the width of the reflection band of the narrowband mirror, which is effected by methods of the layer design of interference layer systems known to the person skilled in the art.

By way of example, the second resonator mirror is formed as a reflective interference filter. The reflective interference filter preferably has, in the region of the wavelength of the laser radiation, a bandwidth of less than 10 nm, in which the reflection is greater than 99% of the maximum reflection in this region.

The laser resonator contains a folding mirror, for example, between the first resonator mirror and the second resonator mirror. In this case, the laser radiation is preferably coupled out through the folding mirror.

In a preferred embodiment of the invention, the folding mirror is formed as a reflective interference filter.

The laser resonator of a surface emitting semiconductor laser according to the invention may contain a nonlinear optical crystal for frequency conversion, in particular for a frequency multiplication such as a frequency doubling, for example, which is preferably arranged between a folding mirror and the second resonator mirror.

The wavelength of the laser radiation may advantageously be tuned by variation of an angle of incidence at which the radiation impinges on the interference filter.

BRIEF DESCRIPTION OF THE DRAWINGS

FIG. 1 shows a schematic illustration of a surface emitting semiconductor laser in accordance with a first exemplary embodiment of the invention, FIG. 2 shows a schematic illustration of a surface emitting semiconductor laser in accordance with a second exemplary embodiment of the invention, FIG. 7 shows a schematic illustration of a surface emitting semiconductor laser in accordance with a seventh exemplary embodiment of the invention.

DETAILED DESCRIPTION OF THE DRAWINGS

Figure 3:
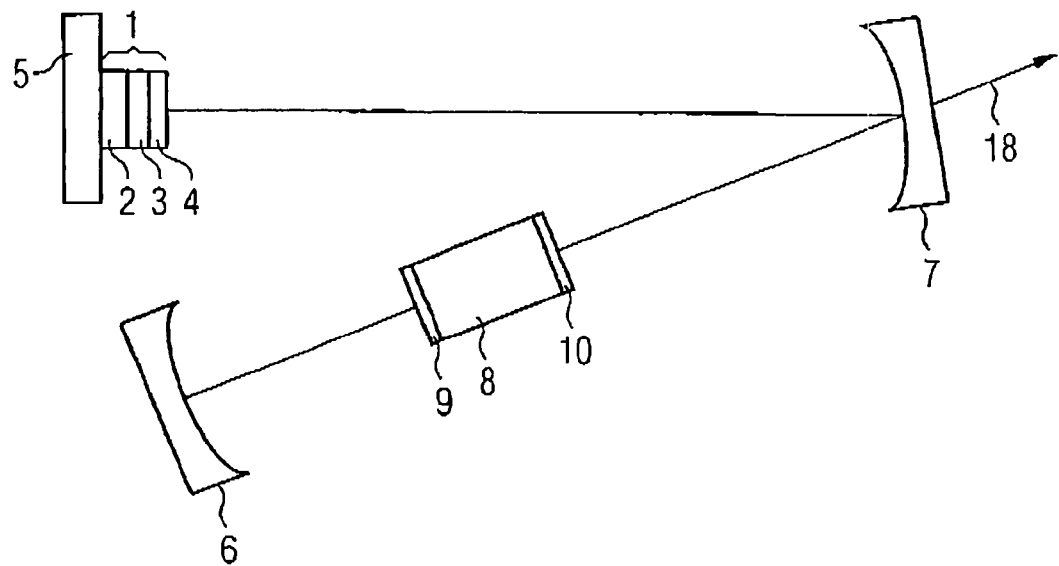
FIG. 3 shows a schematic illustration of a surface emitting semiconductor laser in accordance with a third exemplary embodiment of the invention.

Identical or identically acting elements are provided with the same reference symbols in the figures.

The surface emitting semiconductor laser according to the invention as illustrated in FIG. 1 contains a semiconductor chip 1, which emits radiation 12 from an active zone 4. The active zone 4 contains for example GaAs, AlGaAs, InGaAlP, InAlGaN or some other III-V semiconductor compound.

Furthermore, the semiconductor chip 1 contains a first resonator mirror 3, which may be for example a Bragg reflector grown epitaxially on a semiconductor substrate 2. Further layers contained in the semiconductor chip 1, for example for making electrical contact with the active zone 4, are not represented in the simplified illustration. The embodiment of the semiconductor chip 1 is not restricted to a specific layer sequence known for surface emitting semiconductor chips, but rather can be chosen within the scope of the invention to suit particular purposes and design preferences. By way of example, pump lasers for pumping the active zone may be monolithically integrated in the semiconductor chip 1. As an alternative, the active zone may also be pumped by a pump radiation source outside the semiconductor chip 1 or may be electrically pumped by current injection. The semiconductor chip 1 is mounted on a carrier 5, for example, which may be, in particular, a heat sink.

The first resonator mirror 3 contained in the semiconductor chip 1 forms, with a second resonator mirror 6 arranged outside the semiconductor chip 1, a laser resonator for the laser radiation 12. In this exemplary embodiment, the laser resonator furthermore contains a folding mirror 7, an optically nonlinear crystal 8 for frequency conversion of the laser radiation 12 being contained between the folding mirror 7 and the second resonator mirror 6. The optically nonlinear crystal 8 brings about a frequency doubling of the laser radiation, by way of example. In particular, the semiconductor chip 1 may contain an active zone 4 that emits in the infrared spectral region and the infrared radiation 12 may be converted into visible or ultraviolet light 18 by means of the optically nonlinear crystal 8. The frequency-converted radiation 18 is preferably coupled out through the folding mirror 7. In this case, the folding mirror 7 should have a high reflection for the radiation emitted by the semiconductor chip and a high transmission for the frequency-converted radiation 18. This prevents a feedback of the frequency-converted radiation 18 into the semiconductor chip 1.

The laser resonator contains an optical element 11, which is a thin plain-parallel laminar in this example, with a bandpass filter 9 formed from an interference layer system comprising a plurality of dielectric layers being applied (such as by physical or chemical vapor deposition techniques) to a surface of said optical element 11. The dielectric bandpass filter 9 stabilizes the wavelength and the spectral width of the emitted laser radiation 12. The wavelength of the laser radiation 12 may be tuned for example by variation of the angle $\alpha$ of incidence at which the laser radiation 12 impinges on the filter 9.

The bandpass filter 9 is designed by methods known to a person with ordinary skill in the art with regard to the selection of the layer materials, the layer thicknesses and the sequence of the layers. Examples of known designs can be found in U.S. Pat. No. 4,756,602 which is hereby incorporated by reference. The person skilled in the art knows, in particular, to influence the spectral position of the transmission maximum, the spectral width of the transmission and the value of the maximum transmission through the design of the layer sequence comprising dielectric layers that forms the bandpass filter 9.

In order to minimize the resonator-internal losses, the surface of the optical element 11 that is opposite to the bandpass filter 9 is preferably provided with an antireflection coating 10.

The bandpass filter 9 may be applied to any suitable optical element arranged in the laser resonator within the scope of the invention. In the case of the exemplary embodiment illustrated in FIG. 2, the bandpass filter 9 is applied to a lens 13. The side of the lens 13 that is opposite to the bandpass filter 9 is advantageously provided with an antireflection coating 10. Furthermore, the exemplary embodiment illustrated in FIG. 2 differs from that illustrated in FIG. 1 by the fact that the folding mirror 7 is inclined by 45° relative to the emission direction of the semiconductor chip and therefore forms a right-angled folded resonator.

A further possibility for the positioning of the bandpass filter 9 within the laser resonator is illustrated in FIG. 3. In this case, the bandpass filter 9 is applied to the surface of a nonlinear optical crystal 8 that serves for frequency conversion of the laser radiation. The side of the nonlinear optical crystal 8 that is opposite to the bandpass filter 9 is preferably provided with an antireflection coating 10, which reduces the reflection both for the laser radiation and for the frequency-converted radiation.

Figure 4:
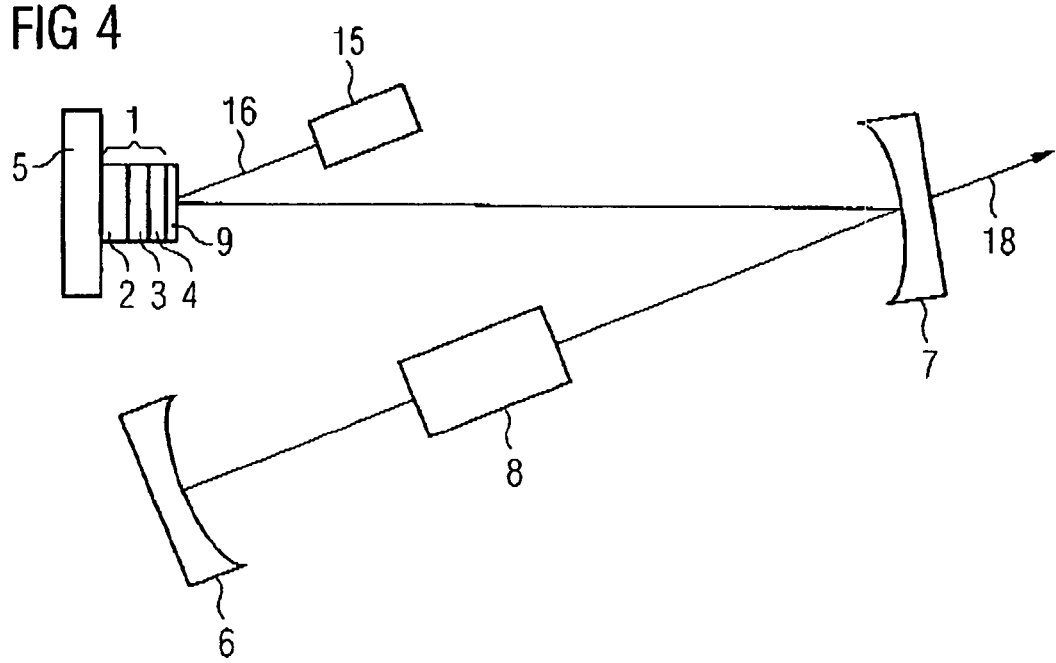
FIG. 4 shows a schematic illustration of a surface emitting semiconductor laser in accordance with a fourth exemplary embodiment of the invention.

As an alternative, as illustrated in FIG. 4, a bandpass filter 9 may also be applied to the surface of the semiconductor chip 1 from which the radiation 12 is emitted. This embodiment is advantageous in particular when no optical elements suitable for application of the bandpass filter are situated within the laser resonator or when said elements can be coated only with difficulty. By way of example, a bandpass filter 9 formed from an interference layer system of dielectric layers can often be applied more simply to a planar surface of the semiconductor chip 1 than to a curved surface of an optical element.

In the case of the exemplary embodiment of the invention as shown in FIG. 4, pump radiation 16 is radiated into the active zone 4 of the semiconductor chip 1 by a pump radiation source 15 arranged outside the semiconductor chip 1. In order to enable the pump radiation 16 to penetrate into the semiconductor chip 1, the bandpass filter 9 has a first passband at the wavelength of the laser radiation 12 and a second passband at the wavelength of the pump radiation 16.

Figure 5:
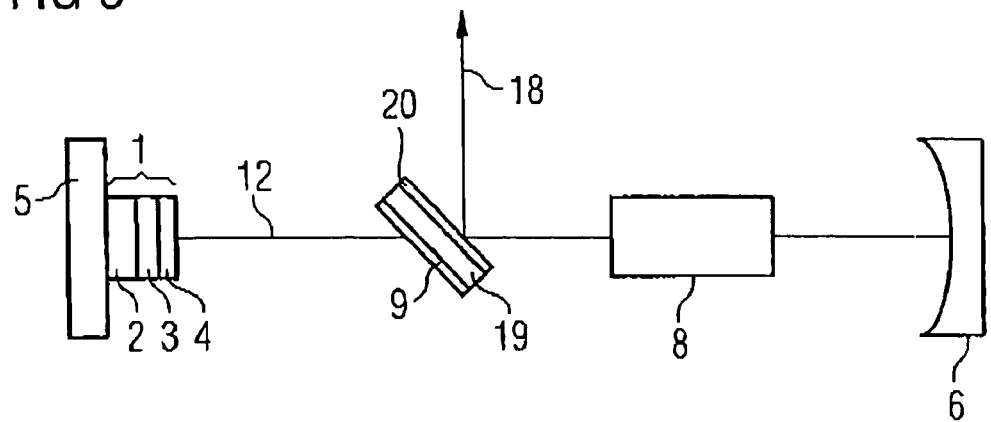
FIG. 5 shows a schematic illustration of a surface emitting semiconductor laser in accordance with a fifth exemplary embodiment of the invention.

The exemplary embodiment of the invention in FIG. 5 contains an optically nonlinear crystal 8 for frequency conversion of the radiation 12 emitted by the semiconductor chip 1 and a beam splitter 19, in which the bandpass filter 9 is applied on a surface facing the semiconductor chip 1. On the opposite surface facing the optically nonlinear crystal 8, the beam splitter 19 is provided with a coating 20 having a high reflection for the frequency-converted radiation 18 and a high transmission for the radiation 12 emitted by the semiconductor chip. In this way, the frequency-converted radiation 18 is coupled out from the laser resonator, while the radiation 12 having the fundamental wavelength of the laser circulates in the resonator.

Figure 6:
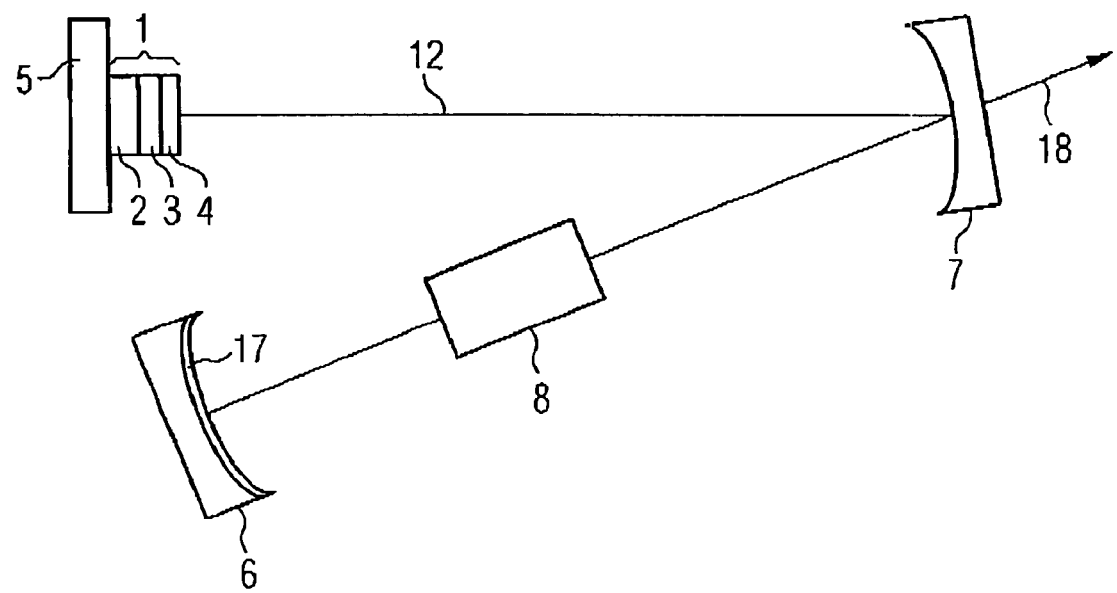
FIG. 6 shows a schematic illustration of a surface emitting semiconductor laser in accordance with a sixth exemplary embodiment of the invention.

In the case of the exemplary embodiment of the invention as illustrated in FIG. 6, the interference filter 17 is applied as a reflective interference layer system 17 on the second resonator mirror 6. The reflection of the narrowband mirror 17 in the region of the wavelength of the laser radiation is preferably of narrowband nature such that it is greater than 99% of the maximum reflection in said region only within a bandwidth of less than 10 nm. The exemplary embodiment of the invention as illustrated in FIG. 6 also has the advantage that the interference filter 17 is applied to a component that is already present anyway in the laser resonator. This advantageously reduces absorption losses that may arise when using a bifringent filter or an etalon for wavelength selection due to the introduction of an additional element into the laser resonator.

Furthermore, as in the exemplary embodiment illustrated in FIG. 7, the interference filter 17 may be a reflective interference filter that is applied to the folding mirror 7. Reflective interference filters are well known to a person with ordinary skill in the art, and an example can be found in U.S. Pat. No. 5,627,426 which is hereby incorporated by reference. The folding mirror 7 is preferably inclined by 45° relative to the emission direction of the semiconductor chip in order to form a right-angled folded resonator. As in the exemplary embodiment illustrated in FIG. 2, the laser radiation is preferably coupled out from the laser resonator through the folding mirror 7. The laser resonator advantageously contains a nonlinear optical crystal 8 that serves for frequency conversion of the laser radiation. For coupling out the frequency-converted radiation, the folding mirror preferably has a high transmission at the wavelength of the frequency-converted radiation.

The surface emitting semiconductor lasers that are illustrated in the exemplary embodiments and in each case have a folded resonator and an optically nonlinear crystal for frequency conversion of the laser radiation are preferred variants of the invention which, however, do not constitute any restriction. It goes without saying that the invention can also be applied to surface emitting semiconductor lasers which do not have a folding mirror or have more complicated resonator constructions with a plurality of folding mirrors. The invention is equally advantageous in the case of surface emitting semiconductor lasers in which, in contrast to the exemplary embodiments shown, frequency conversion of the radiation is not provided.

The invention is not restricted by the description on the basis of the exemplary embodiments. Rather, the invention encompasses any new feature and also any combination of features, which, in particular, comprises any combination of features in the patent claims, even if said feature or said combination itself is not explicitly specified in the patent claims or exemplary embodiments.

We claim:

1. A surface emitting semiconductor laser comprising:
   an optically or electrically pumped semiconductor chip, which emits radiation, and includes a first resonator mirror;
   a second resonator mirror arranged outside the semiconductor chip; and
   a laser resonator for the radiation emitted by the semiconductor chip, the laser resonator comprising the first resonator mirror and the second resonator mirror,
   wherein the second resonator mirror is formed as a reflective interference filter which is a bandpass filter formed from an interference layer system comprising a plurality of dielectric layers,
   wherein the reflective interference filter has, in the region of the wavelength of the laser radiation, a bandwidth of less than 10 nm, in which the reflection is greater than 99% of the maximum reflection in this region, and
   wherein the laser resonator contains a folding mirror between the first resonator mirror and the second resonator mirror.

2. The surface emitting semiconductor laser as claimed in claim 1, wherein at least one pump radiation source is integrated monolithically on the semiconductor chip.

3. The surface emitting semiconductor laser as claimed in claim 1, wherein the laser radiation is coupled out through the folding mirror.

4. The surface emitting semiconductor laser as claimed in claim 1, wherein an optically nonlinear crystal for frequency conversion of the radiation is contained in the laser resonator.

5. The surface emitting semiconductor laser as claimed in claim 4, wherein the frequency conversion is a frequency multiplication.

6. The surface emitting semiconductor laser as claimed in claim 1, wherein the plurality of dielectric layers of the interference layer system comprise a plurality of alternately applied dielectric layers of high and low refractive indices.

7. A surface emitting semiconductor laser comprising:
an optically or electrically pumped semiconductor chip, which emits radiation, and includes a first resonator mirror;
a second resonator mirror arranged outside the semiconductor chip; and
a laser resonator for the radiation emitted by the semiconductor chip, the laser resonator comprising the first resonator mirror and the second resonator mirror,
wherein the laser resonator comprises a folding mirror between the first resonator mirror and the second resonator mirror,
wherein a reflective interference filter is applied to the folding mirror, the reflective interference filter being a bandpass filter formed from an interference layer system comprising a plurality of dielectric layers, and
wherein the reflective interference filter has, in the region of the wavelength of the laser radiation, a bandwidth of less than 10 nm, in which the reflection is greater than 99% of the maximum reflection in this region.

8. The surface emitting semiconductor laser as claimed in claim 7, wherein at least one pump radiation source is integrated monolithically on the semiconductor chip.

9. The surface emitting semiconductor laser as claimed in claim 7, wherein an optically nonlinear crystal for frequency conversion of the radiation is contained in the laser resonator.

10. The surface emitting semiconductor laser as claimed in claim 9, wherein the frequency conversion is a frequency multiplication.

11. The surface emitting semiconductor laser as claimed in claim 7, wherein the plurality of dielectric layers of the interference layer system comprise a plurality of alternately applied dielectric layers of high and low refractive indices.

* * * * *